United States Patent
Cheng et al.

(10) Patent No.: US 10,670,806 B2
(45) Date of Patent: Jun. 2, 2020

(54) METHOD FOR PREPARING FILM MICRO-OPTICAL STRUCTURE BASED ON PHOTOLITHOGRAPHY AND CHEMOMECHANICAL POLISHING

(71) Applicant: Shanghai Institute of Optics And Fine Mechanics, Chinese Academy of Sciences, Shanghai (CN)

(72) Inventors: Ya Cheng, Shanghai (CN); Rongbo Wu, Shanghai (CN); Jintian Lin, Shanghai (CN); Jianhao Zhang, Shanghai (CN); Min Wang, Shanghai (CN)

(73) Assignee: Shanghai Institute of Optics And Fine Mechanics, Chinese Academy of Sciences, Shanghai (CN)

( * ) Notice: Subject to any disclaimer, the term of this patent is extended or adjusted under 35 U.S.C. 154(b) by 0 days.

(21) Appl. No.: 16/404,735

(22) Filed: May 6, 2019

(65) Prior Publication Data
US 2019/0346625 A1    Nov. 14, 2019

(30) Foreign Application Priority Data

May 8, 2018    (CN) .......................... 2018 1 0429577
May 21, 2018   (CN) .......................... 2018 1 0490930
(Continued)

(51) Int. Cl.
*G02B 6/136* (2006.01)
*G03F 7/00* (2006.01)
(Continued)

(52) U.S. Cl.
CPC ................ *G02B 6/136* (2013.01); *C23F 1/26* (2013.01); *G03F 7/0005* (2013.01); *G02B 2006/12097* (2013.01); *G02B 2006/12197* (2013.01)

(58) Field of Classification Search
CPC ....................................................... G02B 6/136
(Continued)

(56) References Cited

PUBLICATIONS

Lin, Jintian, et al., "Fabrication of high-Q lithium niobate microresonators using femtosecond laser micromachining," Scientific Reports, 5: 8072, pp. 1-4 (Jan. 28, 2015).
(Continued)

*Primary Examiner* — Roberts P Culbert
(74) *Attorney, Agent, or Firm* — Mei & Mark LLP; Manni Li (57) ABSTRACT

Method for preparing micro-optical structure on a film based on chemical mechanical polishing etching, combining photolithography technology with chemical mechanical polishing technology to make preparation and large-scale integration of large-size high-quality micro optical devices on-chip possible. The method comprises coating metal on film surface, selectively removing the metal film by photolithography (such as femtosecond laser selective ablation, ultraviolet photolithography, electron beam etching, ion beam etching, and reactive ion etching), chemical mechanical polishing, chemical corrosion or over polishing and other steps. Micro-optical devices on-chip prepared by the method have extremely high surface finish and extremely low optical loss. The method is applicable to preparing high-quality micro-optical structures (including but not limited to microdisc cavities, microring cavities, optical waveguides and coupled devices thereof) on various films on-chip (including but not limited to lithium niobate single crystal films, quartz films, silicon films, silicon dioxide films, diamond thin films, etc.).

16 Claims, 9 Drawing Sheets (30) Foreign Application Priority Data

Jun. 29, 2018 (CN) .......................... 2018 1 0700395
Aug. 27, 2018 (CN) .......................... 2018 1 0982116

(51) Int. Cl.
*C23F 1/26* (2006.01)
*G02B 6/12* (2006.01)

(58) Field of Classification Search
USPC .......................................................... 216/24
See application file for complete search history.

(56) References Cited

PUBLICATIONS

Wang, Jie, et al., "High-Q lithium niobate microdisk resonators on a chip for efficient electro-optic modulation," Optics Express, vol. 23, No. 18, pp. 23072-23078 (Aug. 24, 2015).
Zhang, Mian, et al., "Monolithic ultra-high-Q lithium niobate microring resonator," Optica, vol. 4, No. 12, pp. 1536-1537 (Dec. 2017).

METHOD FOR PREPARING FILM MICRO-OPTICAL STRUCTURE BASED ON PHOTOLITHOGRAPHY AND CHEMOMECHANICAL POLISHING

CROSS-REFERENCE TO RELATED APPLICATIONS

The subject application claims priority on Chinese patent application nos. 201810429577.2 filed on May 8, 2018; 201810490930.8 filed on May 21, 2018; 201810700395.4 filed on Jun. 29, 2018; and 201810982116.8 filed on Aug. 27, 2018, all in China. The contents and subject matter of the four (4) Chinese priority applications are incorporated herein by reference.

FIELD OF TECHNOLOGY

The present invention relates to photolithography and chemomechanical polishing, particularly, a method for preparing microstructures (including microcavity disk, microring, optical waveguide and integrated structures thereof) on-chip by photolithography (such as femtosecond laser selective ablation, ultraviolet photolithography, electron beam etching, ion beam etching, and reactive ion etching) combined with chemo-mechanical polishing. The method is applicable to various film materials on-chip, including but not limited to lithium niobate single crystal film, quartz film, silicon film, silicon dioxide film, diamond film or the like.

BACKGROUND ART

Micro-optical devices are optical devices having microstructure whose size is above submicron level and surface roughness up to nanometer level. Generally, micro-optical devices on-chip significantly increase the interaction of light and matter by spatially and even temporally localizing the optical field. These devices have important applications and development prospects in fundamental research and engineering applications, such as quantum optics, nonlinear optics, quantum electrodynamics, photonics, low threshold maser, ultra-small filter, biosensor, optical gyroscope, optical frequency comb and so on. In the application, microdisc cavity and microring cavity limit light to a small volume for a long time through consecutive multiple total internal reflection at the circular boundary between the medium cavity and the surrounding environment. They have a rather high-quality factor and a very small mode volume, which can greatly enhance the interaction between light and matter.

Optical waveguide on-chip is the basic component of the micro-optical devices on-chip. The high refractive index difference between the waveguide material and the environment is used to bind the light in the optical waveguide, generally showing strong interaction between light and material and low transmission loss.

An integrated device is composed of the micro-cavity and micro-cavity, micro-cavity and optical waveguide, and optical waveguide and optical waveguide, and has controllable coupling efficiency and extremely low insertion loss, and its preparation is difficult in micro optical integration on-chip. Currently, mainstream micro optical devices on-chip, such as microdisc cavity (See Lin, Jintian, et al., "Fabrication of high-Q lithium niobate microresonators using femtosecond laser micromachining," Scientific Reports 5 (2015): 8072; Wang, Jie, et al., "High-Q lithium niobate microdisk resonators on a chip for efficient electro-optic modulation," Optics Express 23.18 (2015): 23072-23078), microring cavity (See Zhang, Mian, et al., "Monolithic ultra-high-Q lithium niobate microring resonator," Optica 4.12 (2017): 1536-1537), and optical waveguide (See Zhang, Mian, et al., "Monolithic ultra-high-Q lithium niobate microring resonator," Optica 4.12 (2017): 1536-1537), are manufactured by semiconductor photolithography or femtosecond laser combined with focused ion beam (FIB) etching. The two technologies have been relatively mature in preparation of microstructure on material surface. However, the former is only suitable for processing semiconductor film material or silicon dioxide film, and often faces difficulties when faced with a medium film that is difficult to be chemically treated, such as lithium niobate, and it is also difficult to prepare high quality structures in millimeter or even centimeter level. The latter is limited by processing efficiency of FIB and faces problems in preparing large-size structures and large-scale integration.

Traditional chemical mechanical polishing is used to prepare a flat material surface, not for the preparation of micro-optical structures on-chip.

SUMMARY OF THE INVENTION

The present invention combines photolithography (such as femtosecond laser selective ablation, ultraviolet photolithography, electron beam etching, ion beam etching, and reactive ion etching) with chemical mechanical polishing etching technology to make preparation of large-scale high-quality micro optical devices on-chip and large-scale integration possible.

The technical problem to be solved in the present invention is to overcome the shortcoming of the existing micro-machining on-chip technology, which is difficult to construct structures in submicron or even centimeter level on a dielectric film or a semiconductor film and provide a method for preparing micro optical structure on a film. The method of the present invention has high processing efficiency, and the prepared micro-optical device has controllable morphology and extremely low loss. The film materials include, but are not limited to, lithium niobate single crystal film, quartz film, silicon film, silicon dioxide film, diamond film, or the like.

The present invention provides a first method for preparing micro-optical structure on a film, which comprises the following steps:

Step 1: Coating a metal film on the surface of a film:

(1) A film sample is composed of a film layer, a pillar layer, and a substrate in the order of from the top to the bottom. The film layer is made of a dielectric film or a semiconductor film, including a lithium niobate film, a quartz film, a silicon dioxide film, a diamond film, a silicon film, or an aluminum nitride film.

(2) A metal film is coated on the surface of the film sample, and the thickness of the metal film is determined according to the required corner morphology.

Step 2: Photolithography:

The surface of the metal film is precisely etched by photolithography to form the required metal pattern layer. Particularly, in one embodiment of the present invention, a femtosecond laser is focused on the surface of the metal film through a microscopic objective lens to ablate the upper surface of the film sample. At the same time, the 3D displacement platform is driven to move so that the femtosecond laser beam can selectively remove the metal film covering the surface of the film on-chip sample until the required metal pattern layer is formed, the step can also be achieved by other lithography techniques such as ultraviolet lithography, electron beam etching, ion beam etching, or reactive ion etching;

Step 3: Chemical mechanical polishing:

(1) The film sample containing the metal film with microstructure pattern is fixed in a mold, polished with a polishing pad and a polishing solution such as a silica pellet suspension. Polishing at a controllable rate is achieved by controlling the pressure exerted to the film on-chip sample, the relative rotating speed of the polishing pad to the film on-chip sample, and the flow rate of the silica pellet suspension. During polishing process, the area of the film covered with the metal pattern layer is retained for having no contact with the polishing pad and the polishing solution, and other area of the film is removed by chemical mechanical polishing. And the closer the film material of the edge of the metal pattern layer is to the edge of the metal pattern layer, the lower the removal efficiency is, and a wedge-shaped corner is formed.

(2) Optical microscope and CCD detector are used to observe the change of the wedge-shaped corner morphology until the wedge-shaped corner morphology meets the design requirements and the polishing is finished.

Step 4: Metal film chemical corrosion:

(1) The chemically mechanically polished film sample is placed in a corrosive solution, and the metal pattern layer is corroded to obtain the micro-optical structure.

Step 5: Pillar layer chemical corrosion:

(1) The film sample is placed in corrosive solution, the pillar layer is corroded as a pillar, and the pillar is directly designed as needed. The step does not need to be performed when the designed structure does not require the lower surface to be suspended.

The present invention also provides a second method of preparing a micro-optical structure on a film that has the same steps as the first method while step 5, pillar layer chemical corrosion, of the first method is replaced by step 5 of coating dielectric film on micro-optical structure surface, i.e., coating a dielectric film on the surface of the micro-optical structure on the film sample. Further, the second method further includes a step 6, 3D electrode preparation where 3D electrode is prepared in the dielectric film.

The present invention further provides a third method for preparing a micro-optical structure on a film that has the same steps as the first method except that step 4 of metal film chemical corrosion in the first method is replaced by a step 4 of over polishing: the film sample with wedge-shaped edge of the metal film and the film layer is further polished, and the thickness of wedge-shaped edge of metal film is getting thinner than that of the center, forming a narrowed metal pattern layer and an ultra-fine rib waveguide, and step 5 is replaced by a step 5 of metal pattern layer chemical corrosion: the chemically mechanically polished film sample is placed in corrosive solution to corrode and remove the narrowed metal pattern layer.

The present invention further provides a fourth method for preparing a micro-optical structure on a film that has the same steps as the first method except that step 3 of chemical mechanical polishing in the first method is replaced by a step 3 of chemical mechanical polishing to remove a part of the film material: the film sample containing a metal pattern layer is fixed in a mold and polished with a polishing pad and a polishing solution. During polishing process, the area of the film covered with the metal pattern layer is retained for having no contact with the polishing pad and the polishing solution, and other area of the film is removed by chemical mechanical polishing. And the closer the film material of the edge of the metal pattern layer is to the edge of the metal pattern layer, the lower the removal efficiency is, and a wedge-shaped corner of the retained portion of the film material is formed. The thinner the metal pattern layer is, the larger the angle of the wedge-shaped corner is; optical microscope and CCD detector are used to observe the change of the wedge-shaped corner morphology until the wedge-shaped corner morphology meets the design requirements and the polishing is finished; and step 5 is replaced by a step 5 of coating and packaging of the micro-optical structure surface: according to the need, a dielectric film can be selectively coated on the surface of the micro-optical structure for packaging.

The present invention further provides a fourth method for preparing a micro-optical structure on a film that has the same steps as the first method except that step 3 of chemical mechanical polishing in the first method is replaced by a step 3 of chemical mechanical polishing to obtain a metal pattern layer with smooth surface and side: the film sample containing a metal pattern layer is fixed in a mold and polished with a polishing pad and a polishing solution. During polishing process, the surface and the side covered with the metal pattern layer are gradually polished to be smooth to form a metal mask 12 with high precision and high smoothness. Optical microscope and CCD detector are used to observe the smoothness at the edge of the metal pattern layer, and when it meets the design requirements, the polishing is finished; the step 4 of metal film chemical corrosion in the first method is replaced by a step (4) of reactive ion etching: the polished film sample with smooth metal mask is placed in a reactive ion etching machine, the etching gas is introduced, the etching power, the etching gas concentration, and the temperature of the reaction chamber are controlled for etching, and the pattern of the metal mask is transferred to the film layer, and the etching is finished until the film layer is completely etched. And step 5 is replaced by a step 5 of metal film chemical corrosion: the chemically mechanically polished film sample is placed in a corrosive solution, and the metal pattern layer is corroded to obtain the micro-optical structure.

In all of the methods of the present invention, the micro-optical structure includes a microdisc cavity, a microring cavity, a ridged and linear optical waveguide, and a coupling structure thereof; the microdisc cavity is a microdisc structure supported by a pillar on the substrate; the optical waveguide is a ridged or linear structure on the substrate; and the microring cavity is composed of a ring-shaped or racetrack-type periodic optical waveguide; the coupling structure is composed of a microdisk cavity and an optical waveguide, a microring cavity and an optical waveguide, a microdisk cavity and a microdisk cavity or an optical waveguide and an optical waveguide; the relative position of the coupling structure is designed according to actual needs.

In the chemical mechanical polishing process of the present invention, the film sample of which the metal film is selectively removed is chemically mechanically polished. The film material close to the edge of the metal film is protected, while the film material away from the metal film is exposed and selectively removed, thereby generating a wedge-shaped corner. Chemical mechanical polishing ensures the smoothness of the wedge-shaped corner, thus ensuring low loss of micro-optical devices. By selecting different metal film thicknesses, as well as chemical mechanical polishing parameters (such as polishing pressure, abrasive particle size, time), wedge-shaped corners of different shapes can be obtained. In the over polishing process, the metal pattern layer is further narrowed, thereby enabling the preparation of ridged waveguides with width in submicron level. Meanwhile, chemical mechanical polishing also removes the rough edge of the metal pattern layer caused by femtosecond laser ablation, thus ensuring the low loss of micro-optical devices. By selecting different metal film thicknesses, as well as chemical mechanical polishing parameters (such as polishing pressure, abrasive particle size, time), ridged waveguides of different widths can be obtained.

Compared with the prior art, the present invention is advantageous in that:

1. It overcomes the difficulty of high-quality processing of chemically stable film materials (such as lithium niobate). The use of chemical mechanical polishing reduces the processing difficulty of film materials and improves the processing efficiency and processing quality.

2. It breaks through the limitations of femtosecond laser micromachining combined with focused ion beam (FIB) etching to fabricate micro-optical devices on-chip, which is, difficult to fabricate large-size micro-devices and difficult to integrate on large scale, and greatly improves the size of micro-optical devices on-chip and the integration efficiency of micro-optical devices on-chip.

3. It provides a method for generating wedge-shaped corners, which have functions of reducing effective mode volume of micro-optical devices, avoiding the loss caused by corners, and controlling modal dispersion. These functions play an important role in field of high-quality microcavity preparation and optical frequency comb generation.

4. Thanks to the extremely high surface smoothness of chemical mechanical polishing, the micro-devices prepared in the invention have extremely low loss, especially the whispering gallery mode microdisc cavity prepared in the invention has extremely high-quality factor.

5. It provides a method for preparing saddle coupling region, which is different from traditional evanescent wave coupling region, greatly reduces the requirement of coupling region on machining accuracy and overcomes the difficulty of preparing coupling region between micro-optical devices on-chip with traditional processing technology.

6. It breaks through the limitation of femtosecond processing on the width of the rib waveguide that can be processed. The width of the rib waveguide is reduced from micron to sub-micron, and single-mode conduction of light in communication band is realized.

DETAILED DESCRIPTIONS OF THE INVENTION AND EMBODIMENTS

In combination with embodiments and figures, the present invention is further expounded. The embodiments and figures are not meant to limit the scope of the present invention.

The coating metal used in the methods of the present invention can be any metal material having a hardness higher than that of the film such as chromium, aluminum or copper.

Silicon dioxide, silicon, etc. of the pillar layer in the film sample used can be any polishing materials corroded with the film layer. The film layer materials used include lithium niobate single crystal film, quartz film, silicon film, silicon dioxide film, diamond film and other dielectric and semiconductor materials. The deposited dielectric film includes silicon dioxide, diamond and other materials. The prepared 3D electrode includes metal electrode such as a gold electrode, a silver electrode, a copper electrode, or a chromium electrode. The lithographic etching technique used includes dry etching, wet etching and reactive ion beam etching. The photoresist used can be positive and negative.

Embodiment 1

Figure 1:
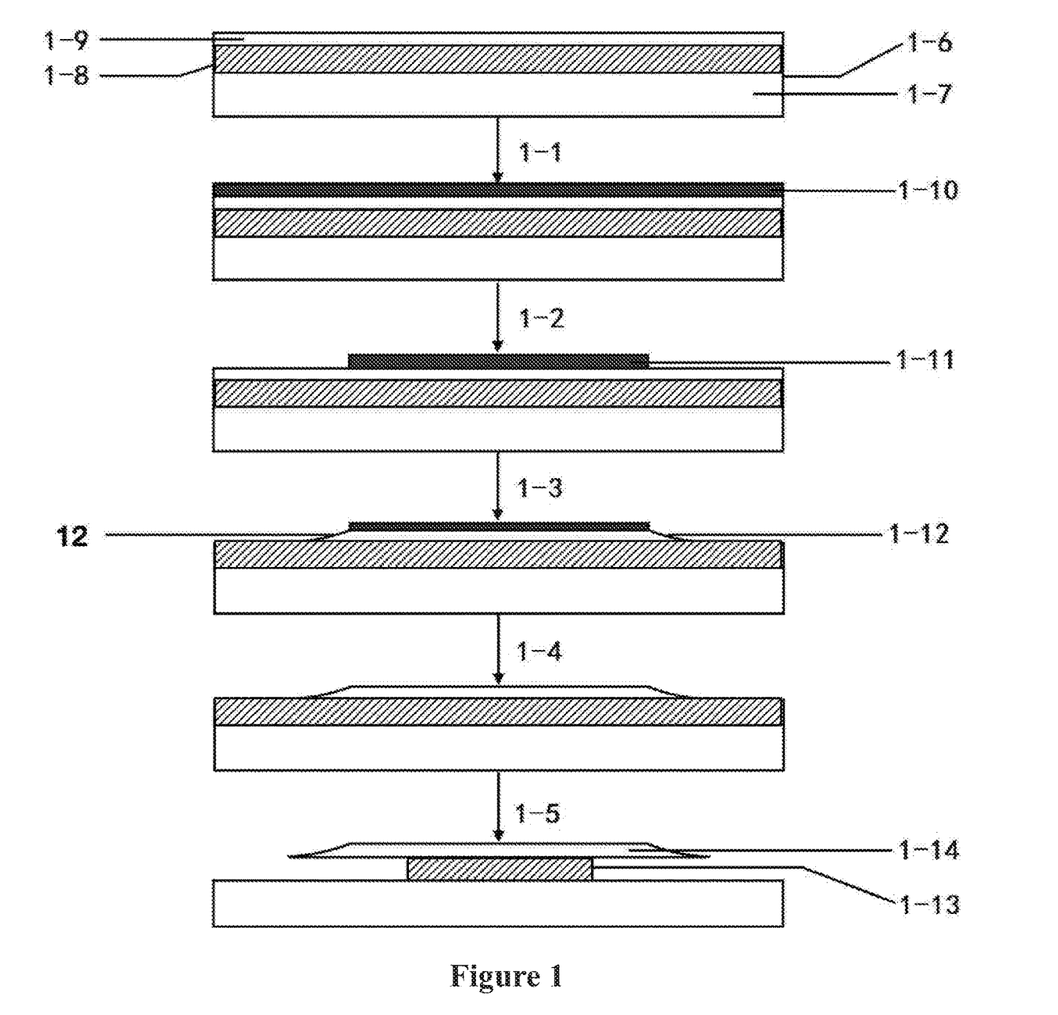
FIG. 1 is a flow diagram showing the method for preparing an optical whispering gallery mode microdisk cavity on-chip with high quality factor by femtosecond laser combined with chemical mechanical polishing in a first embodiment of the present invention.

In the first embodiment of the present invention as shown in FIG. 1, an optical whispering gallery mode microdisk cavity on-chip is prepared by femtosecond laser combined with chemical mechanical polishing in the present invention. The method of the present invention is now illustrated by taking a lithium niobate single crystal film on-chip as an example. As can be seen from the figure, the method for preparing an optical whispering gallery mode microcavity on-chip by femtosecond laser combined with chemical mechanical polishing comprises the following five steps:

(1-1) Coating Cr metal film on surface: Lithium niobate single crystal film on-chip sample 1-6 with size of 3 mm×4 mm×1 mm is taken and is composed of a about 1 mm thick substrate 1-7, a 2 µm thick $SiO_2$ film 1-8 on the substrate and a 900 nm thick $LiNbO_3$ film 1-9 on the $SiO_2$ film. A 900 nm Cr metal film 1-10 is coated on the surface of $LiNbO_3$ film 1-9.

(1-2) Femtosecond laser ablation: the above coated sample is washed with anhydrous ethanol and fixed onto a 3D displacement table; the femtosecond laser etches the surface of the metal film with a pulse width of 40 fs, a center wavelength of 800 nm, and a repetition frequency of 1 KHz; in direct writing of microdisc cavity, a microscope objective lens with a numerical aperture of 0.8 is used to focus, and the average femtosecond laser power is 5 mW; the scanning speed is 10 μm/s; and the microdisk pattern metal protective film 1-11 with a diameter of 100 μm is left.

(1-3) Chemical mechanical polishing: the $LiNbO_3$ single crystal film sample of which the surface Cr film is ablated by femtosecond laser is fixed in a resin mold (the mold is made of plastic resin which is softened by heating, then cooled and molded), and the upper surface in the figure is polished with a gold velvet polishing pad and silicon dioxide suspension of 60 nm for 30 nm. The silica suspension was polished for 30 min. The polishing machine is Shanghai Bihe -UNIPOL-802. In the polishing process, the rotational speed of the gold velvet polishing pad is 100 r/min, the flow rate of the polishing solution is 5 mL/min, and the pressure is 10 $g/cm^2$. A wedge-shaped corner 1-12 with a width of 5 μm is prepared.

(1-4) Cr metal film chemical corrosion: the above chemically mechanically polished sample is placed in an etching solution of Cr (a mixture solution of nitric acid and ammonium cerium nitrate) until the Cr metal film 1-11 is completely removed.

(1-5) Silicon dioxide chemical corrosion: the above sample is placed in a HF solution with 5% concentration (generally concentration of 20% or less is required) or a KOH solution with 5 mol/L concentration (generally concentration of 20 mol/L or less is required) to etch the silicon dioxide film until a small pillar 1-13 with diameter of 80 μm is left. Microdisk structure 1-14 supported by the small pillar 1-13 is obtained.

Embodiment 2

Figure 2:
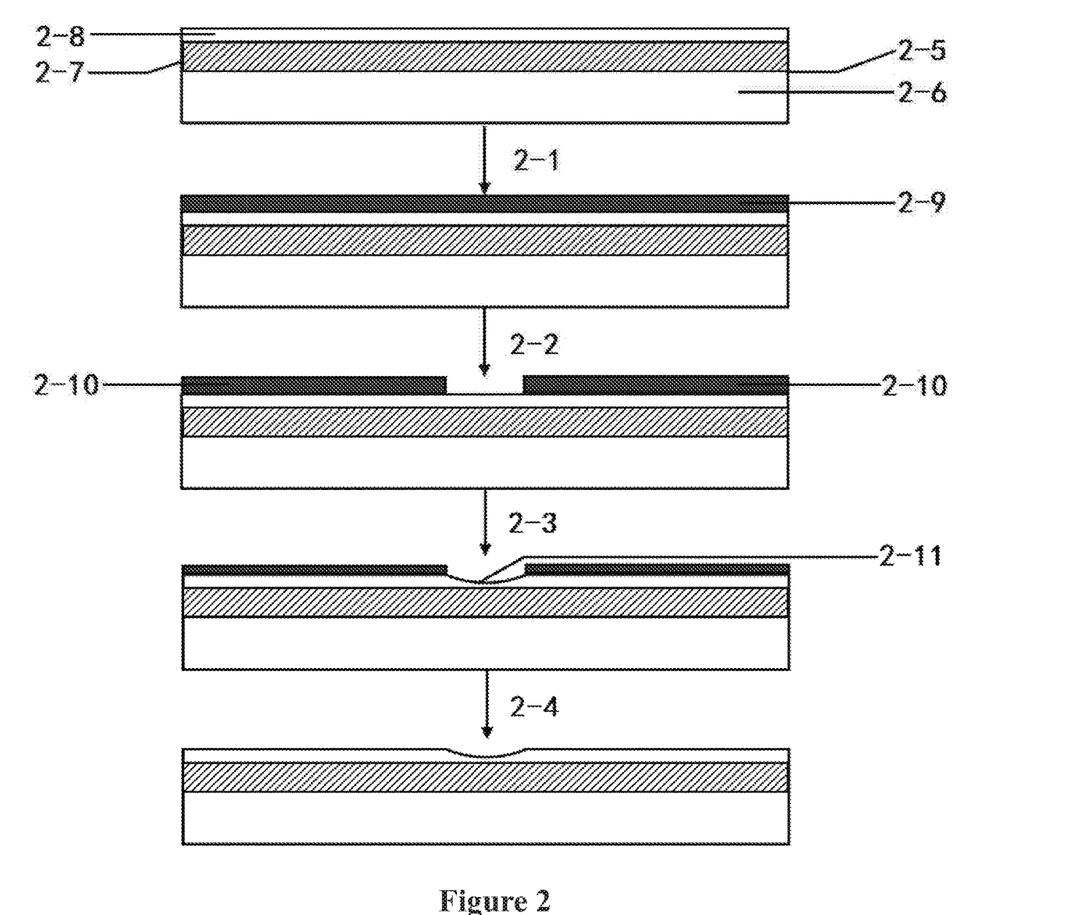
FIG. 2 is a flow diagram showing the method for preparing a saddle coupling region on-chip by femtosecond laser combined with chemical mechanical polishing in a second embodiment of the present invention.

In the second embodiment of the present invention as shown in FIG. 2, a saddle coupling region on-chip is prepared by femtosecond laser combined with chemical mechanical polishing in the present invention. The method of the present invention is now illustrated by taking a lithium niobate single crystal film on-chip as an example. As can be seen from the figure, the method for preparing a saddle coupling region on-chip by femtosecond laser combined with chemical mechanical polishing comprises the following four steps:

(2-1) Coating Cr metal film on surface: Lithium niobate single crystal film on-chip sample 2-5 with size of 3 mm×4 mm×1 mm is taken and is composed of a about 1 mm thick substrate 2-6, a 2 μm thick $SiO_2$ film 2-7 on the substrate and a 900 nm thick $LiNbO_3$ film 2-8 on the $SiO_2$ film. A 900 nm Cr metal film 2-9 is coated on the surface of $LiNbO_3$ film 2-8.

(2-2) Femtosecond laser ablation: the above coated sample is washed with anhydrous ethanol and fixed onto a 3D displacement table; the femtosecond laser etches the surface of the metal film with a pulse width of 40 fs, a center wavelength of 800 nm, and a repetition frequency of 1 KHz; A microscope objective lens with a numerical aperture of 0.8 is used to focus, and the average femtosecond laser power is 5 mW; the scanning speed is 10 μm/s; and the pattern metal protective film 2-10 is left.

(2-3) Chemical mechanical polishing: the $LiNbO_3$ single crystal film sample after femtosecond laser ablation is fixed in a resin mold (the mold is made of plastic resin which is softened by heating, then cooled and molded), and the upper surface in the figure is polished with a gold velvet polishing pad and silicon dioxide suspension of 60 nm for 30 nm. The silica suspension was polished for 30 min. The polishing machine is Shanghai Bihe -UNIPOL-802. In the polishing process, the rotational speed of the gold velvet polishing pad is 100 r/min, the flow rate of the polishing solution is 5 mL/min, and the pressure is 10 $g/cm^2$. A saddle coupling region 2-11 with a width of 5 μm is prepared.

(2-4) Cr metal film chemical corrosion: the above chemically mechanically polished sample is placed in a commercial etching solution of Cr (a mixture solution of nitric acid and ammonium cerium nitrate) until the pattern metal protective film 2-10 is completely removed.

Embodiment 3

Figure 3:
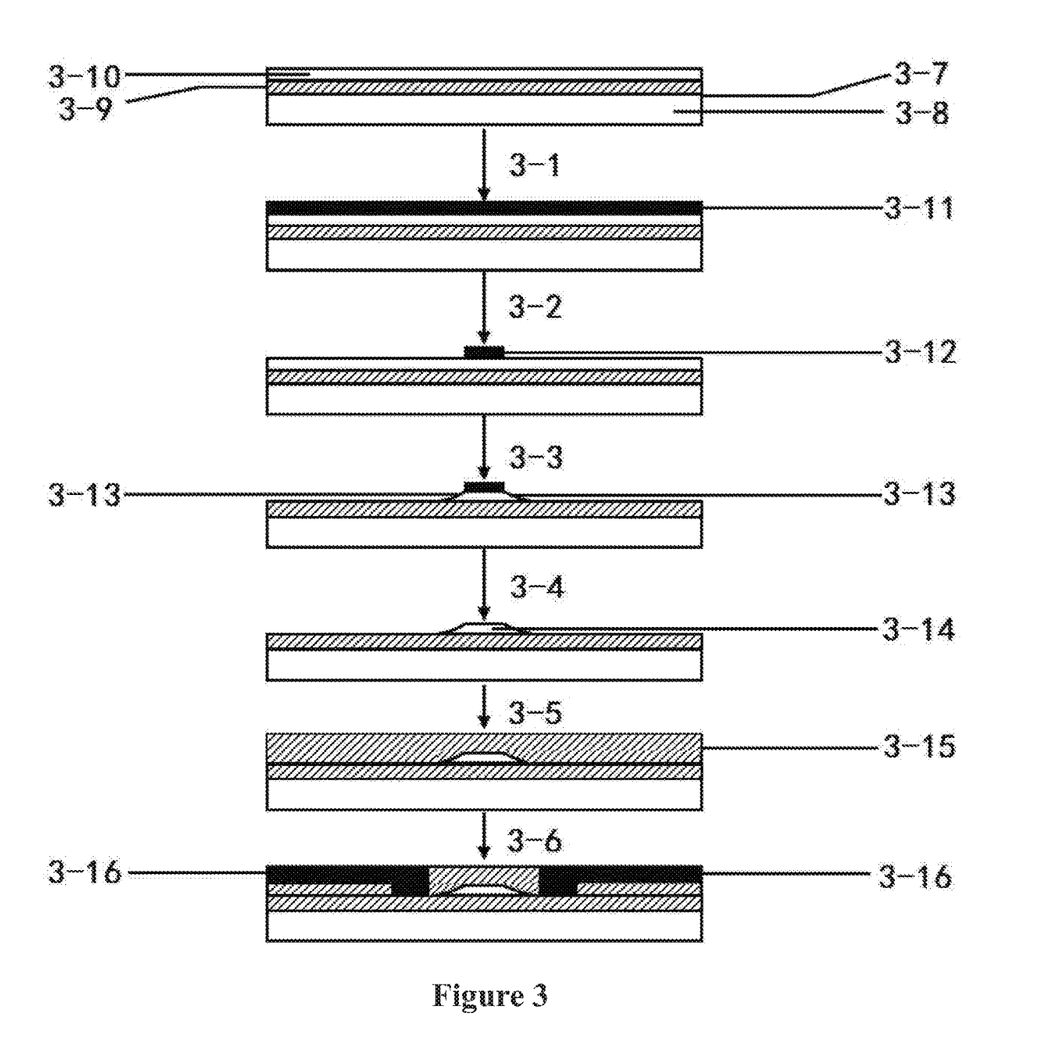
FIG. 3 is a flow diagram showing the method for preparing a low-loss electro-optic tunable waveguide on-chip by femtosecond laser combined with chemical mechanical polishing in a third embodiment of the present invention.

In the third embodiment of the present invention as shown in FIG. 3, a low-loss electro-optic tunable waveguide on-chip is prepared by femtosecond laser combined with chemical mechanical polishing in the present invention. The method of the present invention is now illustrated by taking a lithium niobate single crystal film on-chip as an example. As can be seen from the figure, the method for preparing a low-loss electro-optic tunable waveguide on-chip by femtosecond laser combined with chemical mechanical polishing comprises the following six steps:

(3-1) Coating Cr metal film on surface: Lithium niobate single crystal film on-chip sample 3-7 with size of 3 mm×4 mm×1 mm is taken and is composed of a about 1 mm thick substrate 3-8, a 2 μm thick $SiO_2$ film 3-9 on the substrate and a 900 nm thick $LiNbO_3$ film 3-10 on the $SiO_2$ film. A 900 nm Cr metal film 3-11 is coated on the surface of $LiNbO_3$ film 3-10.

(3-2) Femtosecond laser ablation: the above coated sample is washed with anhydrous ethanol and fixed onto a 3D displacement table; the femtosecond laser etches the surface of the metal film with a pulse width of 40 fs, a center wavelength of 800 nm, and a repetition frequency of 1 KHz; In direct writing of microdisc cavity, a microscope objective lens with a numerical aperture of 0.8 is used to focus, and the average femtosecond laser power is 5 mW; the scanning speed is 10 μm/s; and the waveguide pattern metal protective film 3-12 with a diameter of 100 μm is left.

(3-3) Chemical mechanical polishing: the $LiNbO_3$ single crystal film sample of which the surface Cr film is ablated by femtosecond laser is fixed in a resin mold (the mold is made of plastic resin which is softened by heating, then cooled and molded), and the upper surface in the figure is polished with a gold velvet polishing pad and silicon dioxide suspension of 60 nm for 30 nm. The silica suspension was polished for 30 min. The polishing machine is Shanghai Bihe -UNIPOL-802. In the polishing process, the rotational speed of the gold velvet polishing pad is 100 r/min, the flow rate of the polishing solution is 5 mL/min, and the pressure is 10 $g/cm^2$. A wedge-shaped corner 3-13 with a width of 5 μm is prepared.

(3-4) Cr metal film chemical corrosion: the above chemically mechanically polished sample is placed in an etching solution of Cr (a mixture solution of nitric acid and ammonium cerium nitrate) until the waveguide pattern metal protective film 3-12 is completely removed.

(3-5) coating dielectric film on micro-optical structure surface: the $SiO_2$ film 3-15 is coated on the surface of the micro-optical structure 3-14 on the above film sample by chemical vapor deposition, and the film thickness is 2 μm.

(3-6) 3D electrode preparation: The above film sample deposited with $SiO_2$ is fixed onto the sample tank containing AgNO$_3$ solution with the liquid level slightly higher than the surface of the sample, and then the sample tank is fixed onto a 3D displacement table. The SiO$_2$ film is ablated by femtosecond laser, and AgNO$_3$ solution is irradiated to precipitate Ag onto the ablated surface of SiO$_2$. The femtosecond laser used has a pulse width of 40 fs, a center wavelength of 800 nm, and a repetition rate of 1 KHz; in direct writing of microdisc cavity, a microscope objective lens with a numerical aperture of 0.8 is used to focus, and the average femtosecond laser power is 50 mW; the scanning speed is 10 µm/s; and a 3D electrode frame is formed. The film sample is removed from the sample tank and placed into commercial copper plating bath (CuSO$_4$ solution) to form a 3D copper electrode 3-16.

Embodiment 4

Figure 4:
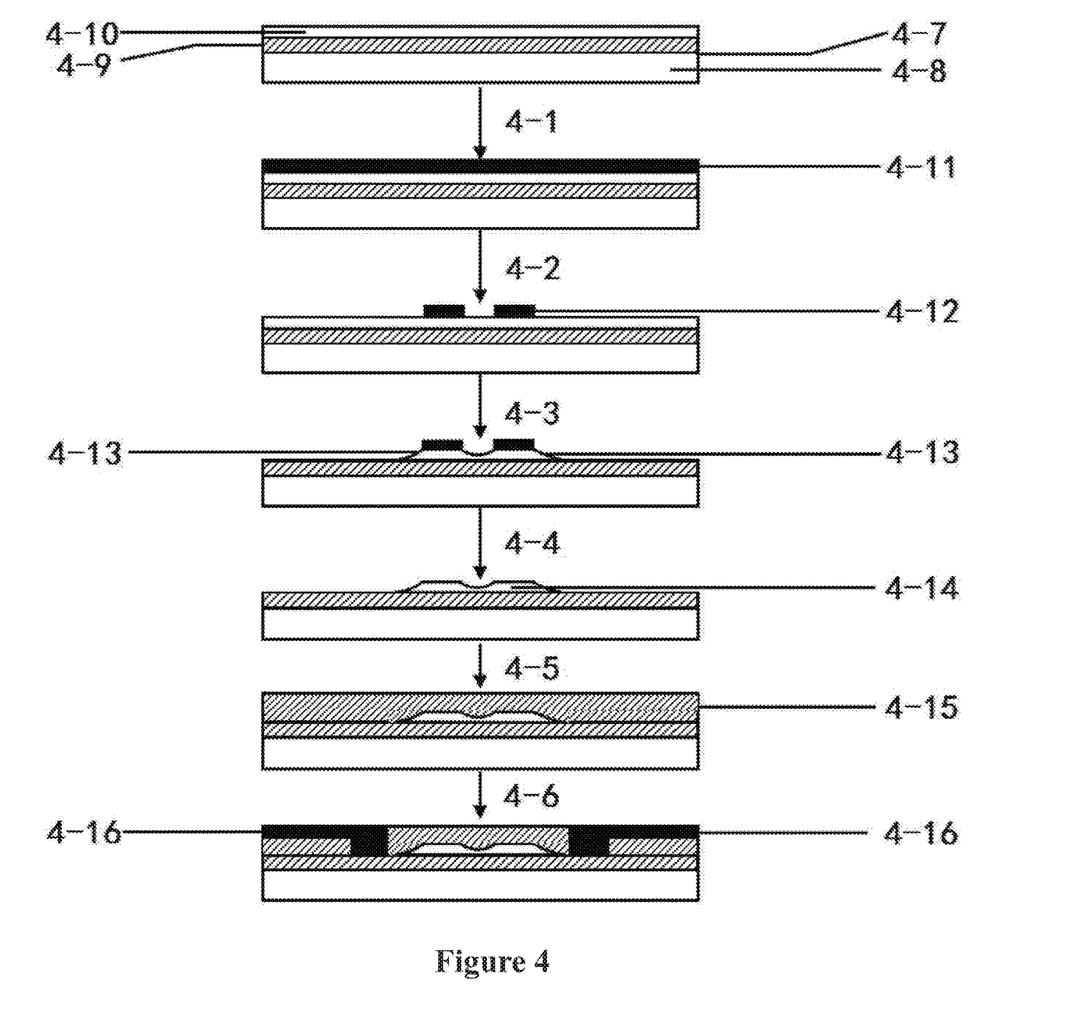
FIG. 4 is a flow diagram showing the method for preparing a low-loss electro-optic tunable coupling waveguide on-chip by femtosecond laser combined with chemical mechanical polishing in a fourth embodiment of the present invention.

In the fourth embodiment of the present invention as shown in FIG. 4, a low-loss electro-optic tunable coupling waveguide on-chip is prepared by femtosecond laser combined with chemical mechanical polishing in the present invention. The method of the present invention is now illustrated by taking a lithium niobate single crystal film on-chip as an example. As can be seen from the figure, the method for preparing a low-loss electro-optic tunable coupling waveguide on-chip by femtosecond laser combined with chemical mechanical polishing comprises the following six steps:

(4-1) Coating Cr metal film on surface: Lithium niobate single crystal film on-chip sample 4-7 with size of 3 mm×4 mm×1 mm is taken and is composed of a about 1 mm thick substrate 4-8, a 2 µm thick SiO$_2$ film 4-9 on the substrate and a 900 nm thick LiNbO$_3$ film 4-10 on the SiO$_2$ film. A 900 nm Cr metal film 4-11 is coated on the surface of LiNbO$_3$ film 4-10.

(4-2) Femtosecond laser ablation: the above coated sample is washed with anhydrous ethanol and fixed onto a 3D displacement table; the femtosecond laser etches the surface of the metal film with a pulse width of 40 fs, a center wavelength of 800 nm, and a repetition frequency of 1 KHz; a microscope objective lens with a numerical aperture of 0.8 is used to focus, and the average femtosecond laser power is 5 mW; the scanning speed is 10 µm/s; and the microdisk pattern metal protective film 4-12 is left.

(4-3) Chemical mechanical polishing: the LiNbO$_3$ single crystal film sample after femtosecond laser ablation is fixed in a resin mold (the mold is made of plastic resin which is softened by heating, then cooled and molded), and the upper surface in the figure is polished with a gold velvet polishing pad and silicon dioxide suspension of 60 nm for 30 nm. The silica suspension was polished for 30 min. The polishing machine is Shanghai Bihe -UNIPOL-802. In the polishing process, the rotational speed of the gold velvet polishing pad is 100 r/min, the flow rate of the polishing solution is 5 mL/min, and the pressure is 10 g/cm$^2$. A coupling waveguide 4-13 with a width of 5 µm is prepared.

(4-4) Cr metal film chemical corrosion: the above chemically mechanically polished sample is placed in a commercial etching solution of Cr (a mixture solution of nitric acid and ammonium cerium nitrate) until the Cr metal film 4-12 is completely removed.

(4-5) coating dielectric film on micro-optical structure surface: the SiO$_2$ film 4-15 is coated on the surface of the micro-optical structure 4-14 on the above film sample by chemical vapor deposition, and the film thickness is 5 µm.

(4-6) 3D electrode preparation: the above film sample deposited with SiO$_2$ is fixed onto the sample tank containing AgNO$_3$ solution with the liquid level slightly higher than the surface of the sample, and then the sample tank is fixed onto a 3D displacement table. The SiO$_2$ film is ablated by femtosecond laser, and AgNO$_3$ solution is irradiated to precipitate Ag onto the ablated surface of SiO$_2$. The femtosecond laser used has a pulse width of 40 fs, a center wavelength of 800 nm, and a repetition rate of 1 KHz; in direct writing of microdisc cavity, a microscope objective lens with a numerical aperture of 0.8 is used to focus, and the average femtosecond laser power is 50 mW; the scanning speed is 10 µm/s; and a 3D electrode frame is formed. The film sample is removed from the sample tank and placed into commercial copper plating bath (CuSO$_4$ solution) to form a 3D copper electrode 4-16.

Embodiment 5

Figure 5:
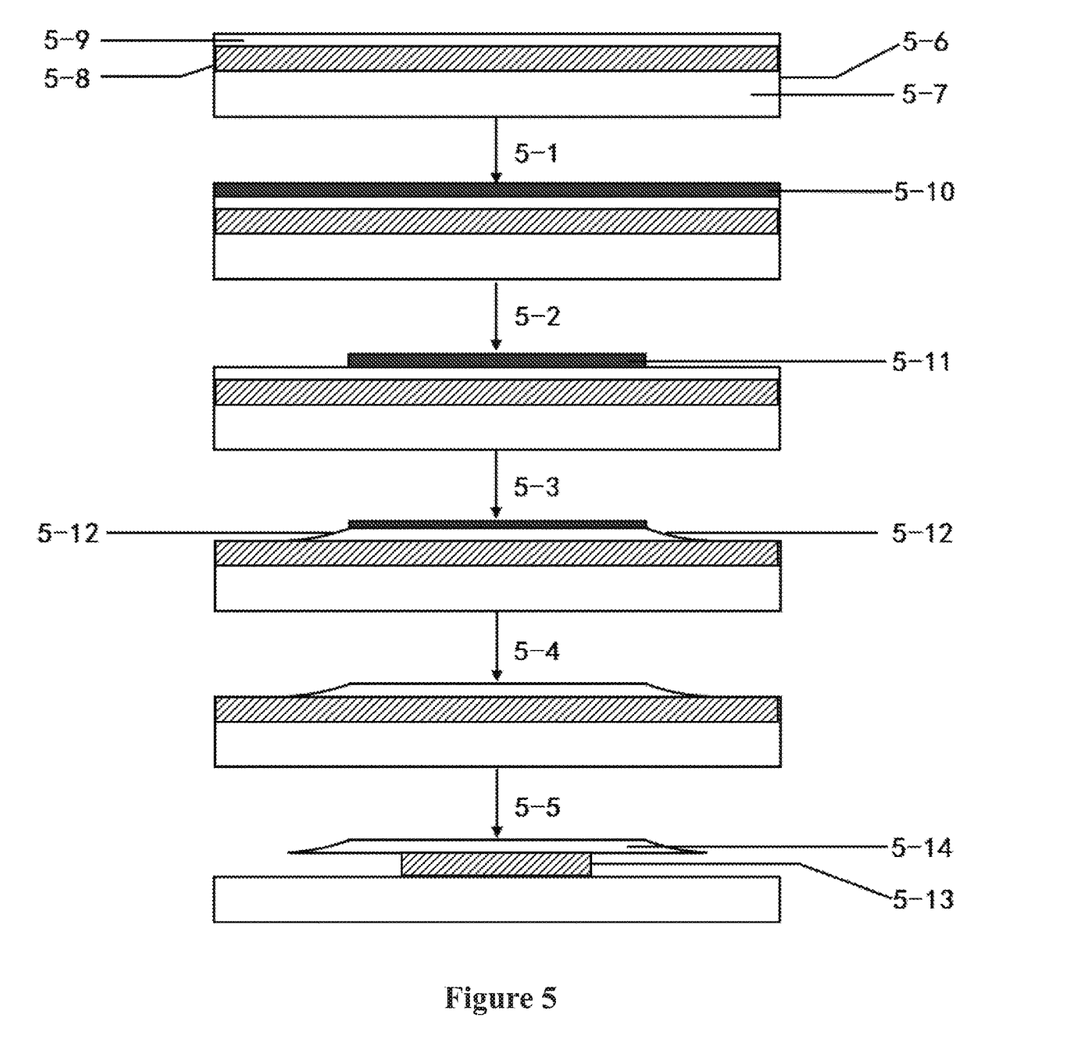
FIG. 5 is a flow diagram showing the method for preparing an optical whispering gallery mode microdisk cavity on-chip with high quality factor by untraviolet photolithography combined with chemical mechanical polishing in a fifth embodiment of the present invention.

In the fifth embodiment of the present invention as shown in FIG. 5, an optical whispering gallery mode microdisk cavity on-chip is prepared by ultraviolet photolithography combined with chemical mechanical polishing in the present invention. The method of the present invention is now illustrated by taking a lithium niobate single crystal film on-chip as an example. As can be seen from the figure, the method for preparing an optical whispering gallery mode microdisk cavity on-chip by ultraviolet photolithography combined with chemical mechanical polishing comprises the following five steps:

(5-1) Coating Cr metal film on surface: Lithium niobate single crystal film on-chip sample 5-6 with size of 3 mm×4 mm×1 mm is taken and is composed of a about 1 mm thick substrate 5-7, a 2 µm thick SiO$_2$ film 5-8 on the substrate and a 900 nm thick LiNbO$_3$ film 5-9 on the SiO$_2$ film. A 900 nm Cr metal film 5-10 is coated on the surface of LiNbO$_3$ film 5-9.

(5-2) Selectively removing the metal film by photolithography: the lithium niobate film sample is fixed on the disperser, and the photoresist is uniformly coated on the surface of lithium niobate film at a speed of 250 r/min, with a thickness of 2 µm. Then the disc-shaped chrome mask is then precisely aligned with the sample for extreme ultraviolet exposure to transfer the disc-shaped mask pattern onto the photoresist layer. Then argon reactive ion beam etching is carried out until the chromium metal film that is not protected by the photoresist is completely removed, and the photoresist is washed away to form a disc-shaped metal protective film 5-11 with a diameter of 100 µm.

(5-3) Chemical mechanical polishing: the lithium niobate single crystal film sample of which the surface Cr film is etched is fixed in a resin mold (the mold is made of plastic resin which is softened by heating, then cooled and molded), and the upper surface in the figure is polished with a gold velvet polishing pad and silicon dioxide suspension of 60 nm for 30 nm. The silica suspension was polished for 30 min. The polishing machine is Shanghai Bihe -UNIPOL-802. In the polishing process, the rotational speed of the gold velvet polishing pad is 100 r/min, the flow rate of the polishing solution is 5 mL/min, and the pressure is 10 g/cm$^2$. A wedge-shaped corner 5-12 with a width of 5 µm is prepared.

(5-4) Cr metal film chemical corrosion: the above chemically mechanically polished sample is placed in an etching solution of Cr (a mixture solution of nitric acid and ammonium cerium nitrate) until the Cr metal film 5-11 is completely removed.

(5-5) Silicon dioxide chemical corrosion: the above sample is placed in a HF solution with 5% concentration (generally concentration of 20% or less is required) or a KOH solution with 5 mol/L concentration (generally concentration of 20 mol/L or less is required) to etch the silicon dioxide film until a small pillar 5-13 with diameter of 80 μm is left. Microdisk structure 5-14 supported by the small pillar 5-13 is obtained.

Embodiment 6

Figure 6:
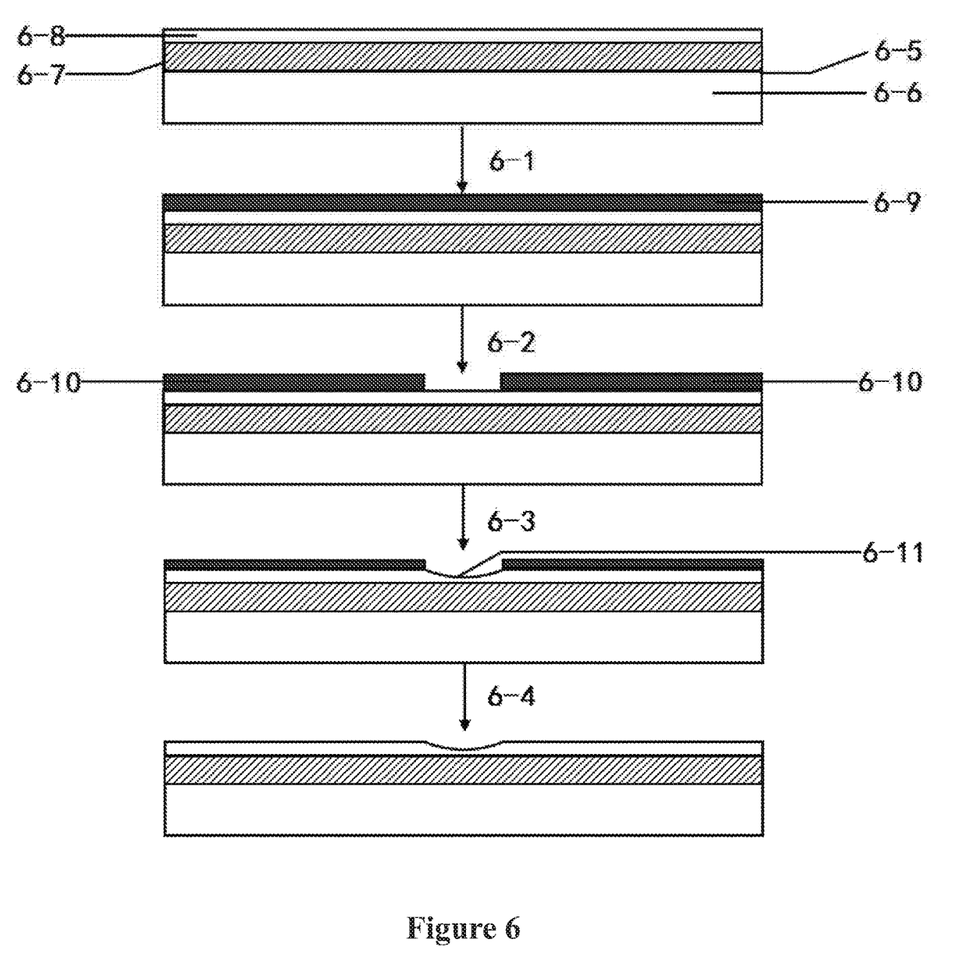
FIG. 6 is a flow diagram showing the method for preparing a coupling region on-chip by untraviolet photolithography combined with chemical mechanical polishing in a sixth embodiment of the present invention.

In the sixth embodiment of the present invention as shown in FIG. 6, a saddle coupling region on-chip is prepared by ultraviolet photolithography combined with chemical mechanical polishing in the present invention. The method of the present invention is now illustrated by taking a lithium niobate single crystal film on-chip as an example. As can be seen from the figure, the method for preparing a saddle coupling region on-chip by ultraviolet photolithography combined with chemical mechanical polishing comprises the following four steps:

(6-1) Coating Cr metal film on surface: Lithium niobate single crystal film on-chip sample 6-5 with size of 3 mm×4 mm×1 mm is taken and is composed of a about 1 mm thick substrate 6-6, a 2 μm thick $SiO_2$ film 6-7 on the substrate and a 900 nm thick lithium niobate film 6-8 on the $SiO_2$ film. A 900 nm Cr metal film 6-9 is coated on the surface of lithium niobate film 6-8.

(6-2) Selectively removing the metal film by photolithography: the lithium niobate film sample is fixed on the disperser, and the photoresist is uniformly coated on the surface of lithium niobate film at a speed of 250 r/min, with a thickness of 2 μm. Then the disc-shaped chrome mask is then precisely aligned with the sample for extreme ultraviolet exposure to transfer the disc-shaped mask pattern onto the photoresist layer. Then argon reactive ion beam etching is carried out until the chromium metal film that is not protected by the photoresist is completely removed, and the photoresist is washed away to form a disc-shaped metal protective film 6-10 with a diameter of 100 μm.

(6-3) Chemical mechanical polishing: the lithium niobate single crystal film sample of which the surface Cr metal film is etched is fixed in a resin mold (the mold is made of plastic resin which is softened by heating, then cooled and molded), and the upper surface in the figure is polished with a gold velvet polishing pad and silicon dioxide suspension of 60 nm for 30 min. The silica suspension was polished for 30 min. The polishing machine is Shanghai Bihe -UNIPOL-802. In the polishing process, the rotational speed of the gold velvet polishing pad is 100 r/min, the flow rate of the polishing solution is 5 mL/min, and the pressure is 10 g/cm². A saddle coupling region 6-11 with a width of 5 μm is prepared.

(6-4) Cr metal film chemical corrosion: the above chemically mechanically polished sample is placed in a commercial etching solution of Cr (a mixture solution of nitric acid and ammonium cerium nitrate) until the pattern metal protective film 6-10 is completely removed.

Embodiment 7

Figure 7:
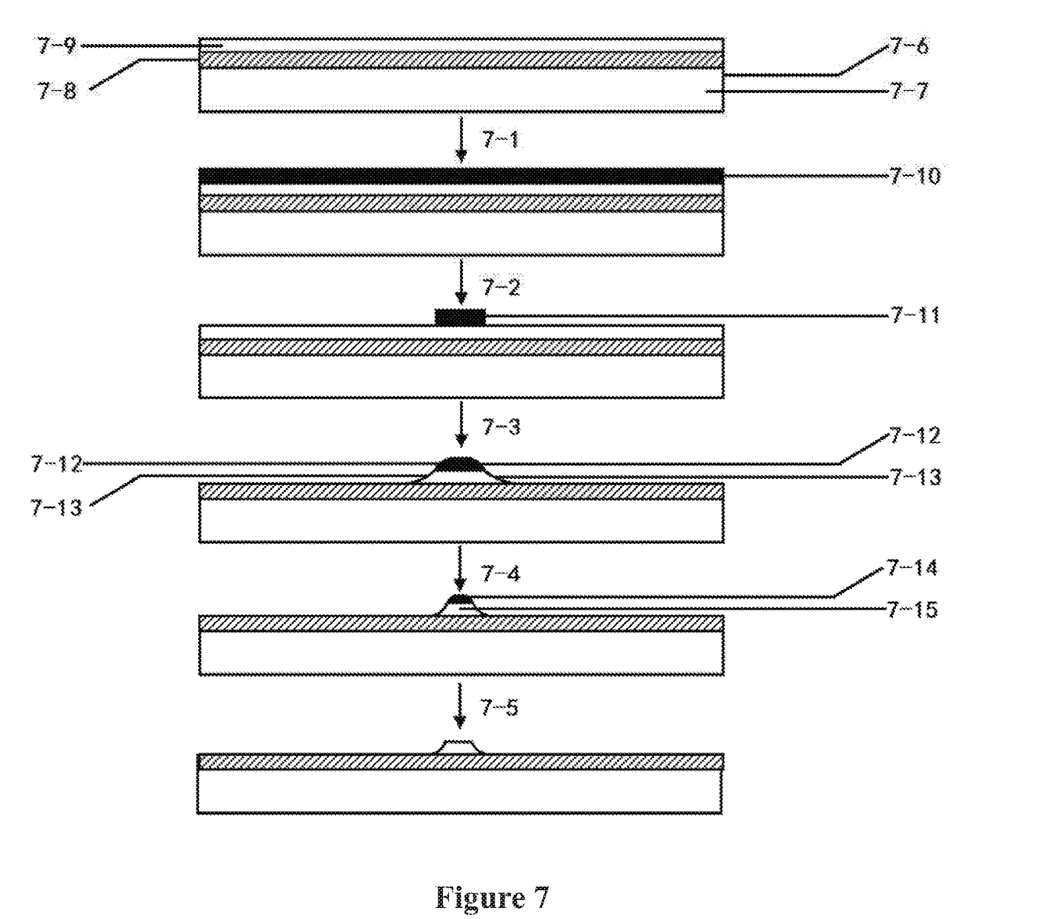
FIG. 7 is a flow diagram showing the method for preparing a low-loss ultra-fine ridge waveguide on-chip by femtosecond laser combined with chemical mechanical polishing in a seventh embodiment of the present invention.

In the seventh embodiment of the present invention as shown in FIG. 7, a low-loss ultra-fine ridge waveguide on-chip is prepared by femtosecond laser combined with chemical mechanical polishing in the present invention. The method of the present invention is now illustrated by taking a lithium niobate single crystal film on-chip as an example. As can be seen from the figure, the method for preparing a low-loss ultra-fine ridge waveguide on-chip by femtosecond laser combined with chemical mechanical polishing comprises the following five steps:

(7-1) Coating Cr metal film on surface: Lithium niobate single crystal film on-chip sample 7-6 with size of 3 mm×4 mm×1 mm is taken and is composed of a about 1 mm thick substrate 7-7, a 2 μm thick $SiO_2$ film 7-8 on the substrate and a 900 nm thick $LiNbO_3$ film 7-9 on the $SiO_2$ film. A 400 nm Cr metal film 7-10 is coated on the surface of $LiNbO_3$ film 7-9.

(7-2) Femtosecond laser ablation: the above coated sample is washed with anhydrous ethanol and fixed onto a 3D displacement table; the femtosecond laser etches the surface of the metal film with a pulse width of 40 fs, a center wavelength of 800 nm, and a repetition frequency of 1 KHz; in direct writing of microdisc cavity, a microscope objective lens with a numerical aperture of 0.7 is used to focus, and the average femtosecond laser power is 0.2 mW; the scanning speed is 300 μm/s; and the waveguide pattern metal protective film 7-11 with a width of 2.5 μm is left.

(7-3) Chemical mechanical polishing: the $LiNbO_3$ single crystal film sample of which the surface Cr film is ablated by femtosecond laser is fixed in a resin mold (the mold is made of plastic resin which is softened by heating, then cooled and molded), and the upper surface in the figure is polished with a gold velvet polishing pad and silicon dioxide suspension of 60 nm for 30 min. The polishing machine is Jinan Kejing -UNIPOL-802. In the polishing process, the rotational speed of the gold velvet polishing pad is 100 r/min, the flow rate of the polishing solution is 5 mL/min, and the pressure is 10 g/cm². A wedge-shaped corner 7-13 with a width of 1 μm is prepared.

(7-4) Over polishing: the above chemically mechanically polished film sample is further polished to obtain a ridged waveguide 7-15 with a width of 500 nm and a narrowed waveguide pattern metal protective film 7-14.

(7-5) Cr metal film chemical corrosion: the above over polished sample is placed in an etching solution of Cr (a mixture solution of nitric acid and ammonium cerium nitrate) until the narrowed waveguide pattern metal protective film 7-14 is completely removed.

Embodiment 8

Figure 8:
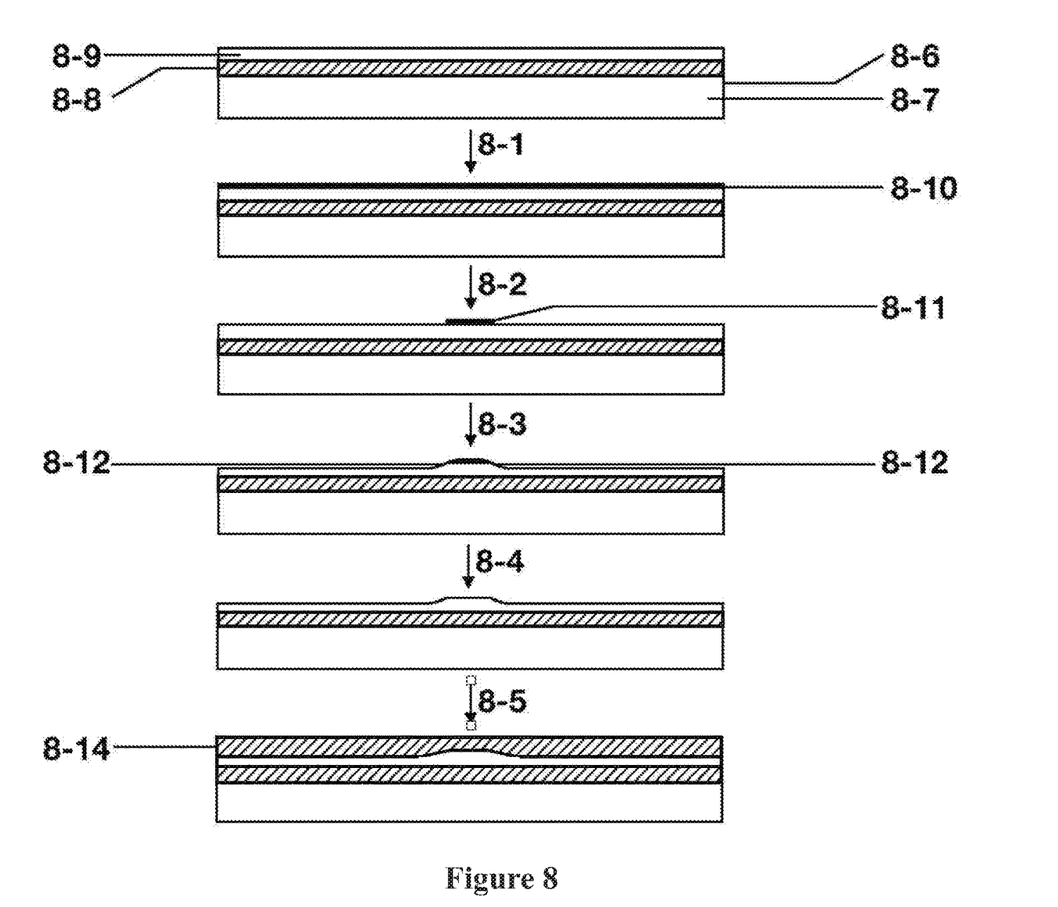
FIG. 8 is a flow diagram showing the method for preparing a single-mode ridge waveguide on-chip by femtosecond laser combined with chemical mechanical polishing in an eighth embodiment of the present invention.

In the eighth embodiment of the present invention as shown in FIG. 8, a single-mode ridge waveguide on-chip is prepared by femtosecond laser combined with chemical mechanical polishing in the present invention. The method of the present invention is now illustrated by taking a lithium niobate single crystal film on-chip as an example. As can be seen from the figure, the method for preparing a single-mode ridge waveguide on-chip by femtosecond laser combined with chemical mechanical polishing comprises the following five steps:

(8-1) Coating Cr metal film on surface: Lithium niobate single crystal film on-chip sample 8-6 with size of 3 mm×4 mm×1 mm is taken and is composed of a about 1 mm thick substrate 8-7, a 2 μm thick $SiO_2$ film 8-8 on the substrate and a 300 nm thick $LiNbO_3$ film 8-9 on the $SiO_2$ film. A 50 nm Cr metal film 8-10 is coated on the surface of 8-9.

(8-2) Femtosecond laser ablation: the above coated sample is washed with anhydrous ethanol and fixed onto a 3D displacement table; the femtosecond laser etches the surface of the metal film with a pulse width of 40 fs, a center wavelength of 800 nm, and a repetition frequency of 250 KHz; in direct writing of microdisc cavity, a microscope objective lens with a numerical aperture of 0.75 is used to focus; the scanning speed is 40 mm/s; and the ridge metal protective film 8-11 with a width of 0.8 μm is left.

(8-3) Chemical mechanical polishing: the LiNbO$_3$ single crystal film sample of which the surface Cr film is ablated by femtosecond laser is fixed in a resin mold (the mold is made of plastic resin which is softened by heating, then cooled and molded), and the upper surface in the figure is polished with a gold velvet polishing pad and silicon dioxide suspension of 60 nm for 1 min. The polishing machine is Jinan Kejing -UNIPOL-802. In the polishing process, the rotational speed of the gold velvet polishing pad is 100 r/min, the flow rate of the polishing solution is 5 mL/min, and the pressure is 10 g/cm$^2$. The 50 nm lithium niobate single crystal film is removed to prepare a wedge-shaped corner 8-12 with a width of 0.8 μm is prepared.

(8-4) Cr metal film chemical corrosion: the above chemically mechanically polished sample is placed in an etching solution of Cr (a mixture solution of nitric acid and ammonium cerium nitrate) until the Cr metal film 8-11 is completely removed.

(8-5) Coating and packaging of the surface: A 1 μm of silicon dioxide film is coated on the surface of the above sample by electron beam evaporation.

Embodiment 9

Figure 9:
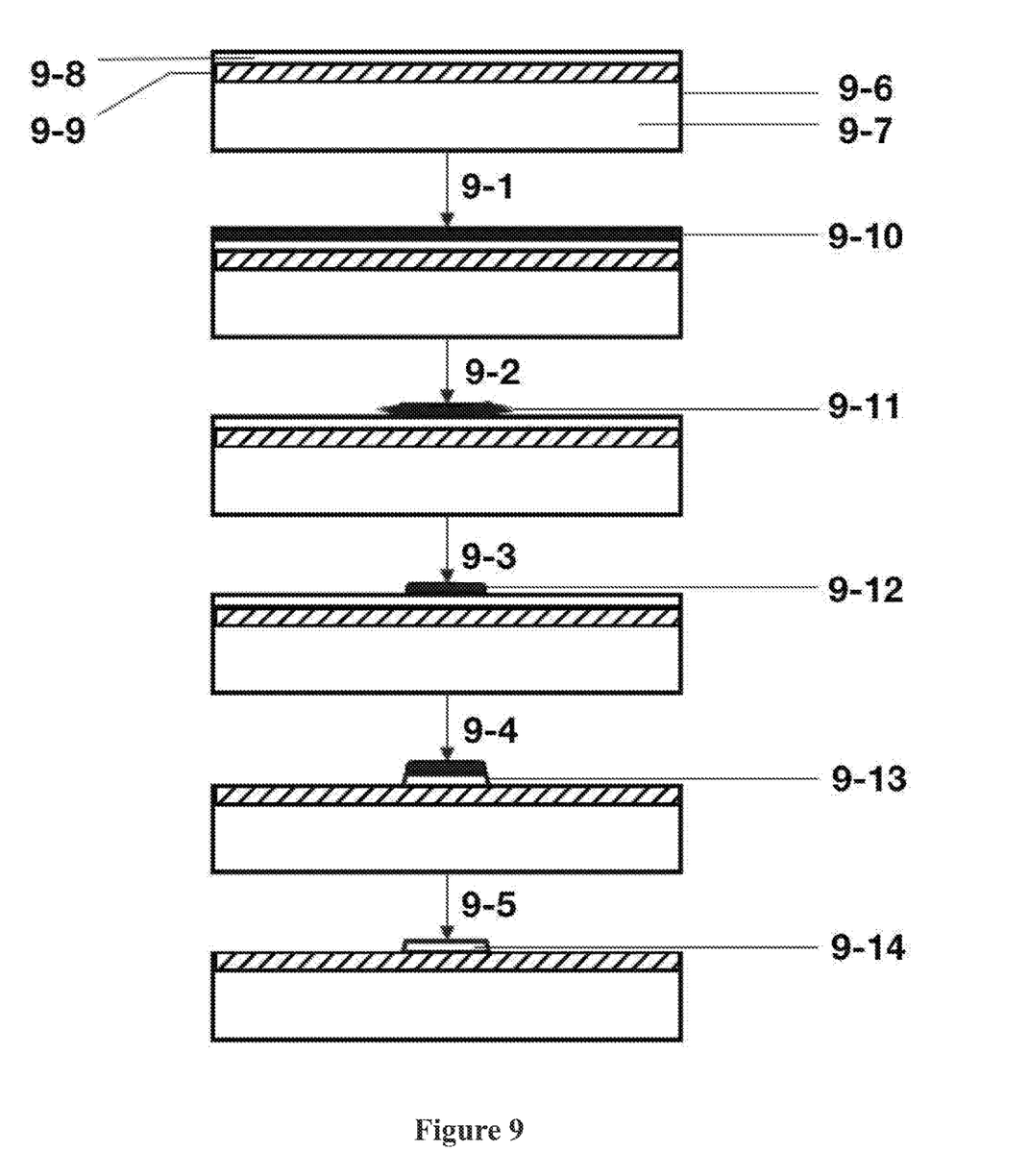
FIG. 9 is a flow diagram showing the method for preparing a single-mode straight waveguide on-chip by f chemical mechanical polishing combined with inductively coupled plasma etching in a ninth embodiment of the present invention.

In the ninth embodiment of the present invention as shown in FIG. 9, a single-mode straight waveguide on-chip is prepared by chemical mechanical polishing combined with inductively coupled plasma etching in the present invention. The method of the present invention is now illustrated by taking a lithium niobate single crystal film on-chip as an example. As can be seen from the figure, the method for preparing a single-mode straight waveguide on-chip by femtosecond laser combined with chemical mechanical polishing comprises the following five steps:

(9-1) Coating Cr metal film on surface: Lithium niobate single crystal film on-chip sample 9-6 with size of 3 mm×4 mm×1 mm is taken and is composed of a about 1 mm thick substrate 9-7, a 2 μm thick SiO$_2$ film 9-8 on the substrate and a 700 nm thick LiNbO$_3$ film 9-9 on the SiO$_2$ film. A 700 nm Cr metal film 9-10 is coated on the surface of 9-9.

(9-2) Femtosecond laser ablation: the above coated sample is washed with anhydrous ethanol and fixed onto a 3D displacement table; the femtosecond laser etches the surface of the metal film with a pulse width of 40 fs, a center wavelength of 800 nm, and a repetition frequency of 1 KHz; in direct writing of microdisc cavity, a microscope objective lens with a numerical aperture of 0.8 is used to focus, and the average femtosecond laser power is 5 mW; the scanning speed is 10 μm/s; and the waveguide pattern metal protective film 7-11 with a width of 2.5 μm is left. A Cr protective film with linear pattern 9-11 having a width of 1 um and a length of 3 mm is left, and the side walls of the metal layer are rough.

(9-3) Chemical mechanical polishing: the LiNbO$_3$ single crystal film sample of which the surface Cr film is ablated by femtosecond laser is fixed in a resin mold (the mold is made of plastic resin which is softened by heating, then cooled and molded), and the upper surface in the figure is polished with a gold velvet polishing pad and silicon dioxide suspension of 60 nm for 10 min. The polishing machine is Shanghai Bihe -UNIPOL-802. In the polishing process, the rotational speed of the gold velvet polishing pad is 110 r/min, the flow rate of the polishing solution is 5 mL/min, and the pressure is 1000 g/cm$^2$. A smooth sidewall of Cr film 9-12 is prepared.

(9-4) Inductively coupled plasma etching: the above chemically and mechanically polished sample is washed with acetone and placed in an inductively coupled plasma reactive ion etching machine, controlling the inductively coupled plasma power to be 1000 W, the RF electrode power to be 75 W, the temperature of the reaction chamber to be 5° C., introducing argon gas at a flow rate of 15 sccm., etching for 25 minutes, and the area not covered by Cr film is completely removed.

(9-5) Cr metal film chemical corrosion: the above etched sample is placed in a commercial Cr etching solution (a mixture of nitric acid and ammonium cerium nitrate) until the pattern metal protective film 9-10 is completely removed to form a single-mode straight waveguide with ultra-low loss 9-14.

We claim:

1. A method for preparing a micro-optical structure on a film, comprising:
    (1) coating a metal film on a surface of a film sample, wherein the film sample comprises a film layer, a pillar layer, and a substrate in an order from a top to a bottom, and the film layer is made of a dielectric film or a semiconductor film,
    (2) precisely etching a surface of metal film by photolithography to form a metal pattern layer,
    (3) conducting chemomechanical polishing by
    fixing the film sample containing the metal pattern layer in a mold, polishing the film sample with a polishing pad and a polishing solution, and forming a wedge-shaped corner at edges of the film sample close to edges of the metal pattern layer, wherein an area of the film sample covered with the metal pattern layer is retained for having no contact with the polishing pad and the polishing solution, and other area of the film sample is removed by chemical mechanical polishing, and
    using optical microscope and CCD detector to observe change in morphology of the wedge-shaped corner until the wedge-shaped corner morphology meets design requirements, and finishing polishing,
    (4) placing the chemomechanically polished film sample in a corrosive solution and corroding the metal pattern layer by a metal film chemical corrosion to obtain a micro-optical structure.

2. The method for preparing a micro-optical structure on a film of claim 1, wherein the photolithography of step (2) is femtosecond laser etching, ultraviolet photolithography, electron beam etching, ion beam etching, or reactive ion etching.

3. The method for preparing a micro-optical structure on a film of claim 1, further comprising
    (5) placing the film sample in a corrosive solution and corroding the pillar layer as a pillar as needed, wherein the micro-optical structure is required to be suspended.

4. The method for preparing a micro-optical structure on a film of claim 1, further comprising
    (5) coating a dielectric film on a surface of the micro-optical structure on the film sample, and
    (6) preparing a 3D electrode in the dielectric film.

5. The method for preparing a micro-optical structure on a film of claim 2, wherein the photolithography of step (2) is ultraviolet photolithography,
    step (5) further comprises placing the film sample in a corrosive solution and corroding the pillar layer as a pillar as needed, wherein the micro-optical structure is required to be suspended.

6. The method for preparing a micro-optical structure on a film of claim 1, wherein step (4) is conducted by over polishing, wherein the film sample with wedge-shaped edge of the metal film and the film layer is further polished, and thickness of the wedge-shaped edge of metal film is getting thinner than that of the center, forming a narrow metal pattern layer and an ultra-fine rib waveguide, and
the method further comprises
(5) placing the chemomechanically polished film sample in a corrosive solution to corrode by a narrow metal pattern layer chemical corrosion, and
removing the narrow metal pattern layer.

7. The method for preparing a micro-optical structure on a film of claim 1, wherein step (3) is conducted by chemical mechanical polishing to remove a part of the film material:
fixing the film sample containing a metal pattern layer in a mold and polishing with a polishing pad and a polishing solution; during polishing process, retaining an area of the film covered with the metal pattern for having no contact with the polishing pad and the polishing solution, and removing other area of the film by chemical mechanical polishing; and the closer the film material of the edge of the metal pattern layer is to the edge of the metal pattern layer, the lower the removal efficiency is, and a wedge-shaped corner of the retained portion of the film material is formed; and the thinner the metal pattern layer is, the larger the angle of the wedge-shaped corner is; and
using an optical microscope and CCD detector to observe change of the wedge-shaped corner morphology until the wedge-shaped corner morphology meets the design requirements of the single-mode waveguide and finishing the polishing;
and the method further comprises step (5) coating and packaging of the micro-optical structure surface by
selectively coating a dielectric film on a surface of the micro-optical structure for packaging according to the need.

8. The method for preparing a micro-optical structure on a film of claim 1, wherein step (3) is conducted by chemical mechanical polishing to obtain a metal pattern layer with smooth surface and side by
fixing the film sample containing a metal pattern layer in a mold and polishing with a polishing pad and a polishing solution; during polishing process, the surface and the side covered with the metal pattern layer are gradually polished to be smooth to form a metal mask 12 with high precision and high smoothness; an optical microscope and CCD detector are used to observe the smoothness at the edge of the metal pattern layer, and when it meets the design requirements, the polishing is finished; and
step (4) is conducted by reactive ion etching by
placing the polished film sample with smooth metal mask in a reactive ion etching machine, introducing the etching gas, and controlling the etching power, the etching gas concentration, and the temperature of the reaction chamber for etching, and transferring the pattern of the metal mask to the film layer, and finishing the etching until the film layer is completely etched; and
the method further comprises step (5) metal film chemical corrosion by
placing the chemically mechanically polished film sample in a corrosive solution, and corroding the metal pattern layer to obtain the micro-optical structure.

9. The method for preparing the micro-optical structure on the film of claim 1, wherein the film layer consists of a dielectric film and a semiconductor film.

10. The method for preparing a micro-optical structure on a film of claim 9, wherein the dielectric film is lithium niobate film, quartz film, silicon dioxide film, or diamond film.

11. The method for preparing a micro-optical structure on a film of claim 9, wherein the semiconductor film is a silicon film or an aluminum nitride film.

12. The method for preparing a micro-optical structure on a film of claim 1, wherein the micro-optical structure comprises a microdisc cavity, a microring cavity, a ridged and linear optical waveguide, and a coupling structure thereof;
the microdisc cavity is a microdisc structure supported by a pillar on the substrate;
the optical waveguide is a ridged or linear structure on the substrate;
the microring cavity is composed of a ring-shaped or racetrack-type periodic optical waveguide; and
the coupling structure is composed of a microdisk cavity and an optical waveguide, a microring cavity and an optical waveguide, a microdisk cavity and a microdisk cavity, or an optical waveguide and an optical waveguide, and relative position of the coupling structure is designed as needed.

13. The method for preparing a micro-optical structure on a film of claim 1, wherein the angle and width of the wedge-shaped corner are controlled by controlling polishing time, rotating speed, and the particle size of polishing solution, and
size of the micro-optical structure, angle of the wedge-shaped corner, and diameter of the pillar of the suspended structure are determined by design.

14. The method for preparing a micro-optical structure on a film of claim 1, wherein hardness of the metal film is higher than that of the film layer, and thickness of the metal film is determined according to the required corner morphology.

15. The method for preparing a micro-optical structure on a film of claim 1, wherein size of the micro-optical structure is between sub-micron level and centimeter level.

16. The method for preparing a micro-optical structure on a film of claim 1, wherein the polishing solution is silica pellet suspension, aluminum oxide pellet suspension, or diamond pellet suspension.

* * * * *